(12) United States Patent
Delzer

(10) Patent No.: US 7,158,901 B2
(45) Date of Patent: Jan. 2, 2007

(54) FFT ACCELERATED DISPLAY MODE

(75) Inventor: Donald J. Delzer, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 237 days.

(21) Appl. No.: 10/890,958

(22) Filed: Jul. 12, 2004

(65) Prior Publication Data
US 2006/0010244 A1    Jan. 12, 2006

(51) Int. Cl.
*G06F 19/00* (2006.01)
(52) U.S. Cl. .................... 702/77; 324/76.11
(58) Field of Classification Search ............... 702/77, 702/76, 182–185; 324/76.11
See application file for complete search history.

(56) References Cited

U.S. PATENT DOCUMENTS 3,883,726 A * 5/1975 Schmidt .................. 708/404
5,353,233 A * 10/1994 Oian et al. ................. 702/76
6,006,245 A * 12/1999 Thayer ...................... 708/404

\* cited by examiner

*Primary Examiner*—Edward Raymond
(74) *Attorney, Agent, or Firm*—Francis I. Gray

(57) ABSTRACT

An FFT accelerated display mode for a spectrum analyzer processes time domain samples in increments as they are received until a complete measurement frame of samples is processed to provide a desired frequency resolution. After a first set of time domain samples is received, a spectrum analysis display is provided having a coarse frequency resolution. Then the spectrum analysis display is updated at intervals as more and more time domain samples are received until the complete measurement frame is processed, providing the desired frequency resolution for the spectrum analysis display.

1 Claim, 1 Drawing Sheet

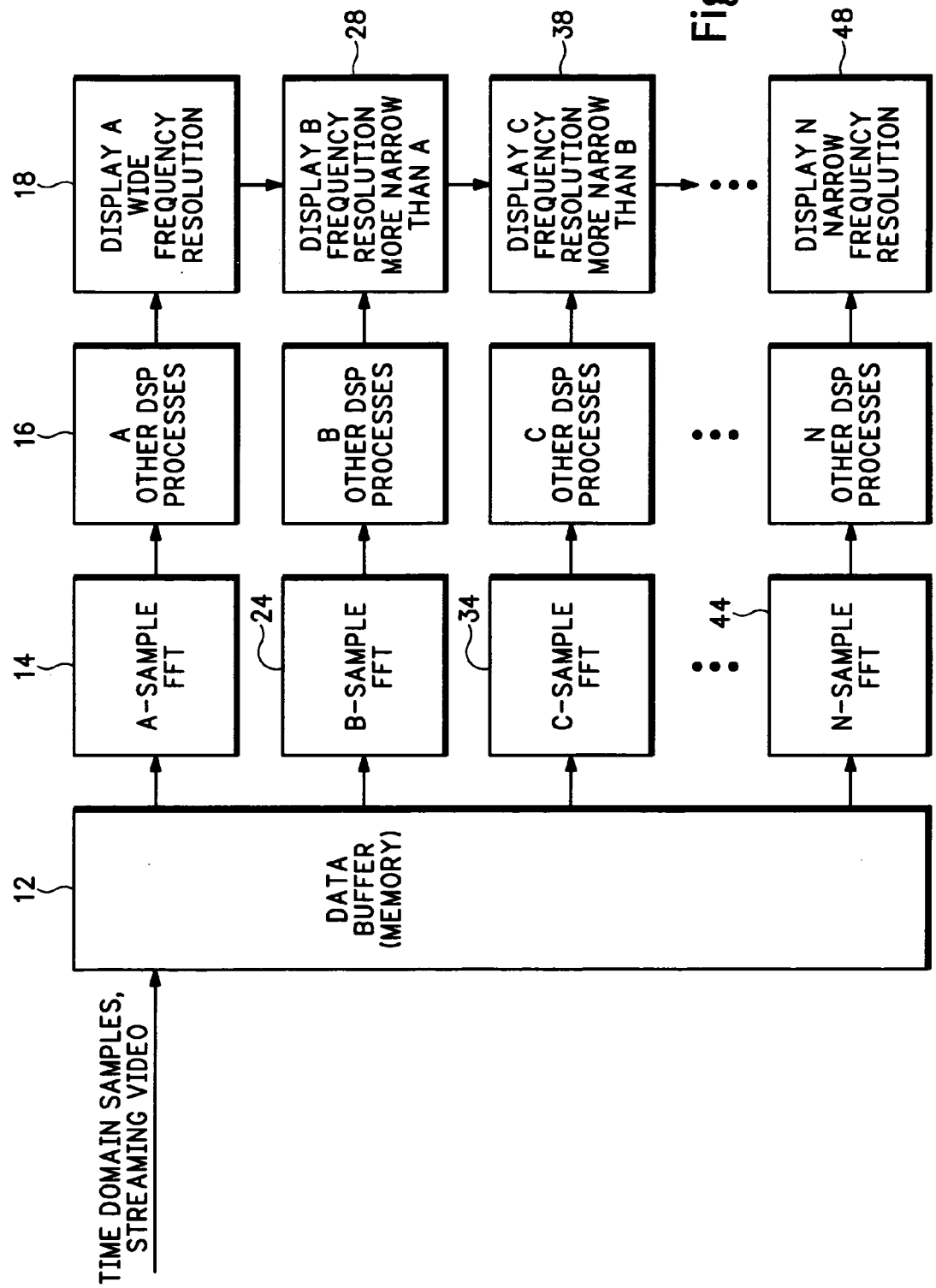

FFT ACCELERATED DISPLAY MODE

BACKGROUND OF THE INVENTION

The present invention relates to spectrum analysis, and more particularly to an FFT accelerated display mode for a spectrum analyzer.

When a user wishes to see very fine spectrum resolution over a wide span on a spectrum analyzer display, it takes a long time to acquire and process the data. The frequency resolution of an FFT process is proportional to (Sample rate)/(Number of samples). In order to accomplish narrow frequency resolution in a spectrum measurement, the sample rate has to be slow, or the number of samples has to be large, or some combination of both. The result is long acquisition times for narrow frequency resolution and proportionately short acquisition times for wide frequency resolution.

When the narrow frequency resolution is desired on a spectrum analyzer, the screen is blank for a long time while the analyzer acquires and processes the data. For example, a 1024-point FFT having a sample rate of 160 samples/sec has a blank screen for 6.4 seconds (1024/160) until the first frame is acquired. Although there may be a note displayed saying "acquiring" or "busy", the long wait time is annoying and may give the user the feeling that nothing is happening, especially when acquisition times are more than a few seconds.

What is desired is an FFT accelerated display mode that provides a user with a display as the data is being acquired and processed.

BRIEF SUMMARY OF THE INVENTION

Accordingly the present invention provides an FFT accelerated display mode that displays spectrum measurements to a user quickly. The FFT accelerated display mode processes time domain samples in increments as they are received until a complete measurement frame of samples is processed to provide a desired frequency resolution. After a first set of time domain samples is received, a spectrum analysis display is provided having a coarse (or wide) frequency resolution. Then the spectrum analysis display is updated at intervals as more and more time domain samples are received until the complete measurement frame is processed, providing the desired frequency resolution for the spectrum analysis display.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 1 is a diagrammatic view of an FFT accelerated display process according to the present invention.

DETAILED DESCRIPTION OF THE INVENTION

Referring now to FIG. 1 time-domain data samples stream into a data buffer 12 when they become available from processes (not shown), such as an analog-to-digital converter output or a digital down-converter output. When a few samples are available a first FFT (A-Sample) 14 calculates the spectrum which may or may not be processed in other subsequent digital signal processing (DSP) steps 16. The spectrum result is displayed to the user as a first display (Display A) 18. The delay time experienced by a user necessary to display the result is short for two reasons: (1) there are only a small number of samples used, such as 16, so the sampling processes are short compared to a large number of samples, such as 1024 or more; and (2) the calculation time also is short because having a small number of samples is not as much work for the processing system compared to a large number of samples. Display A 18 may be displayed without much delay after the measurement starts, but the spectrum information displayed is coarse, i.e., since the number of samples in process "A" is smaller than subsequent processes, the resolution is wider (more coarse) than others. Display A has a blockish-looking frequency resolution.

A second FFT (B-Sample) 24 is calculated on a larger set of samples, such as 32, than the A-Sample FFT 14. The set of samples for the A-Sample FFT is included in the B-Sample FFT together with additional samples. The frequency resolution of the resulting Display B 28 is narrower than Display A, but the time taken to process Display B is longer since more samples from the sampling process are required and the calculation time for B processes requires more work than for A processes. When available, Display B replaces Display A.

Likewise a third FFT (C-Sample) 34 is calculated on a larger set of samples, such as 64, which includes the samples used by the A-Sample and B-Sample FFTs 14, 24. The frequency resolution is narrower still and, when available, Display C 38 replaces Display B.

Any number of FFTs may be added between A and N, each acting on more samples than the last. The last FFT (N-Sample) 44 is the end of the spectrum measurement. Display N 48 has the finest frequency resolution, and takes the longest to process.

The display updates, A through N, may have a 2× frequency resolution improvement over the prior display update, with the update time for each display update taking 2× times longer than the preceding display update. However the user has an almost immediate display of the measure spectrum, and can quickly observe the wide-resolution spectrum components.

What is claimed is:
1. An FFT accelerated display mode process comprising the steps of:
streaming time domain samples for a signal into a data buffer representing a measurement frame that provides a desired frequency resolution;
providing a spectrum analysis display from an initial number of time domain samples when received in the data buffer from the streaming step;
updating the spectrum analysis display when a specified number of additional time domain samples have been received in the data buffer from the streaming step;
repeating the updating step until the spectrum analysis display encompasses the measurement frame.

* * * * *